United States Patent [19]
Sato

[11] 4,334,189
[45] Jun. 8, 1982

[54] OPERATION SUPERVISORY APPARATUS OF CANNED MOTOR

[76] Inventor: Tetsuya Sato, No. 4-34, Hirano, Shingu-Cho, Ibo-Gun, Hyogo Pref., Japan

[21] Appl. No.: 98,399

[22] Filed: Nov. 29, 1979

[30] Foreign Application Priority Data

Dec. 8, 1978 [JP] Japan .............................. 53/152947

[51] Int. Cl.³ ................. G01R 31/02; G01R 31/06; G08B 21/00
[52] U.S. Cl. ........................... 324/158 MG; 324/51; 324/140 R; 340/648
[58] Field of Search ................. 324/158 MG, 51, 127, 324/140 R; 340/648; 328/115, 116; 361/23, 30

[56] References Cited

U.S. PATENT DOCUMENTS

| 3,458,812 | 7/1969 | Krussmann et al. | 328/116 |
| 4,001,689 | 1/1977 | Williams et al. | 324/158 MG |
| 4,211,973 | 7/1980 | Sato et al. | 324/158 MG |

FOREIGN PATENT DOCUMENTS

| 36-29303 | 11/1961 | Japan . |
| 38-22618 | 10/1963 | Japan . |
| 41-6495 | 4/1966 | Japan . |
| 44-1864 | 1/1969 | Japan . |
| 47-14801 | 5/1972 | Japan . |
| 48-1296 | 1/1973 | Japan . |
| 51-16085 | 2/1976 | Japan . |

*Primary Examiner*—Ernest F. Karlsen
*Attorney, Agent, or Firm*—James E. Nilles

[57] ABSTRACT

An operation supervisory apparatus of a canned motor comprising a first detection device for detecting mechanically abnormal operation and electrically abnormal operation of a canned motor a second detection device for detecting the rotating direction of the canned motor, a combining circuit combining an output signal from the first detection and second detection devices and taking out the greater output signal of the two, and an indicator displaying an output signal from the combining circuit. The output signal of the second detection device at the time of reverse rotation of the canned motor being set to a value greater than the output signal thereof at the time of normal rotation and than the output signal of the first detection device within the range of normal operation of the canned motor. The first detection device is constructed by disposing even-numbered detection coils in a stator core of a radial air gap type canned motor to space each other by a polar pitch or integer times the polar pitch and electrically connected in series with each other so that their fundamental wave components offset each other.

4 Claims, 11 Drawing Figures

OPERATION SUPERVISORY APPARATUS OF CANNED MOTOR

FIELD OF THE INVENTION

This invention relates to an operation supervisory apparatus of a canned motor and particularly to an apparatus which supervises mechanically abnormal operation, electrically abnormal operation and rotating directions of the canned motor.

DESCRIPTION OF THE PRIOR ART

A canned motor has gained a wide application principally as a pump motor. Since the pump motor especially deals with a chemical solution or the like, its operating condition must be supervised from outside because small trouble of the motor sometimes leads to a critical accident.

To meet with this demand, the inventor of this invention proposed previously "Operation supervisory apparatus of motor" (Japanese Patent Application No. 101,731/72) and "Operation supervisory apparatus of canned motor" (Japanese Utility Model Application No. 17,882/73), and further "Motor equipped with operation supervisory apparatus" (Japanese Utility Model Application No. 151,559/76) in which an indicator of the abovementioned operation supervisory apparatus is fitted to a terminal box of the motor in an explosion-proof construction. The above applications 101,731/72 and 17,882/73 correspond to U.S. Pat. No. 4,211,973.

Accordingly, the explanation will be first made on an example of the principle of each of the abovementioned operation supervisory apparatuses with reference to FIGS. 1 and 2. In a dipolar, radial air gap type induction motor having stator core 1 and rotor 6 having even-numbered rotor grooves 6a, two detection coils 2a and 2b are embedded at symmetric positions with each other inside the stator core 1 with the core tooth portion 3 being as their center, and are connected in series with each other to form a detection section 4 in such an arrangement that fundamental wave components induced on these detection coils are offset with each other, and an indicator such as a voltmeter 5, for example, is connected across the outputs of the detection section 4. In this case, when the rotor 6 starts rotating upon making of the power source, magnetic flux cross each other on both detection coils 2a, 2b, thereby inducing a voltage. This induced voltage consists of a fundamental wave voltage in synchronism with the power source frequency and a higher harmonic wave voltage due to the influence of the rotor grooves 6a overlapping the fundamental wave voltage. Accordingly, across the outputs of the detection section 4, which consists of both detection coils 2a and 2b connected in series with each other so that the fundamental wave components are offset with each other, there appears as a detection voltage a difference of the higher harmonic wave voltages.

Though this detection voltage is substantially zero during the normal operation of the motor, it exhibits the trend of increase during the abnormal operation. By indicating this change due to the abnormal operation in terms of a voltage change using a voltmeter 5, therefore, it is possible to detect such abnormal operation of a motor, exemplified by a canned motor, as wear of a bearing, eccentricity of rotor, swinging-core operation, phase-skip operation, short-circuit operation, reverse rotation, deformation contact of a can, and so forth.

Detection of the reverse rotation in these operation supervisory apparatuses is based on the fact that the rotating condition of the rotor varies between the normal rotation and the reverse rotation due to the influence of the pump vane wheel, and the output of the detection coils increases during the reverse rotation due to the change of a load current of the motor or the like. Depending upon the shape and size of the pump vane wheel or on the motor characteristics, however, it sometimes occurs that the difference of the output of the detection coils is so small between the normal rotation and reverse rotation of the rotor that determination of the rotating direction becomes extremely difficult.

As a method of confirming the rotating direction in such a case, there has conventionally been a method in which so-called idling is made without charging a solution to be handled by the pump so as to check the rotating direction of the pump vane wheel directly through a suction port of the pump casing with naked eyes. Since the bearing of the canned motor generally uses the solution to be handled by the pump as its lubricant, however, abnormal wear and seizure tend to occur on the bearing if idling is effected. This tendency is specifically remarkable when the motor is larger in scale, and idling even for only several seconds often disables the bearing itself. Hence, this method is not much practical. Further, this method is not at all feasible in such a case where the canned motor is already equipped with pipings or in the case of a vertical type canned motor in which the pump vane wheel can not be observed with eyes through the suction port of its casing.

As methods of confirming the rotating direction of the rotor while the canned motor is being actually operated, there have been a method which estimates the rotating direction by means of a pump discharge pressure or a discharge flow quantity; a method which estimates the rotating direction by means of vibration or noise of the pump; a method which estimates the rotating direction by the phase sequence of a three-phase power source to be fed to the motor; and so forth. The former two methods estimate the rotating direction of the rotor by means of the difference of the pump discharge pressure and discharge flow quantity of the pump or by means of the vibration and noise of the pump between the normal rotating direction and the reverse rotating direction of the rotor, but this difference is often so delicate that judgement becomes extremely difficult. Accordingly, these methods make it necessary to rotate the motor in both normal and reverse directions for the comparison purpose and to change the phase sequence in order to realize the normal and reverse rotating directions of the motor. Besides these complicated procedures, the methods further require specific disposition of a pressure gauge or a flow meter in the piping arrangement to determine the rotating direction, or call for the use of a vibrometer.

The latter method determines the rotating direction of a motor, of which the relation between the phase sequence and the rotating direction is already known, by detecting the phase sequence of the three-phase power source using a phase detector. However, the phase detector must always be taken with the canned motor if the motor is of a portable type, and extremely troublesome phase detection work must be carried out everytime the canned motor is moved from one place to another. In a canned motor of the type which is to be placed in a dangerous atmosphere such as a canned motor of the explosion-proof construction, detection of the phase sequence of the power source, which is outside the dangerous atmosphere, must first be made and the connection sequence of a power cable at the detected position with the power terminals of the motor must then be made. This work is not only troublesome but also misleading.

Since the rotating portions of the canned motor are not exposed to the outside as described above, confirmation of its rotating direction is extremely difficult. This has been the most critical problem with the conventional canned motor. To solve this problem, various apparatuses have so far been proposed as illustrated below.

For example, there have been proposed "Detector of the rotating direction and displacement of a rotary shaft in the axial direction" as disclosed in Japanese Utility Model Publication No. 14,801/1972, "Canned motor" disclosed in Japanese Utility Model Publication No. 1,296/1973, and "Peeping device for wear rate of bearing of canned motor pump" disclosed in Japanese Utility Model Publication No. 1,864/1969. Each of these apparatuses provides a transparent sight hole so as to observe the rotary shaft through this sight hole. However, they are not free from the following various problems. First, confirmation of the rotating direction is extremely difficult except the start of the motor when the speed of revolution of the rotary shaft is extremely slow. Next, if the sight hole is dim or contaminated or when a solution to be handled is opaque in the canned motor pump, visual observation of the rotary shaft becomes difficult. Further, when the rotary shaft is placed in a high pressure system or vacuum system or where an explosion-proof construction is required, the construction of the sight hole must be complicated and rigid, thereby increasing the cost of its production. In addition, the construction of the main frame itself must be modified in order to dispose the sight hole.

Japanese Utility Model Publication No. 6,495/1966 entitled "Reverse rotation indicating device for underwater pump" discloses a construction wherein a rotary body is fitted to a vertical rotary shaft and is allowed to move up and down in accordance with rotating directions of the rotary shaft when the latter rotates, in order to confirm the rotating direction by visually observing the upward or downward movement of the rotary body through a sight hole. However, this prior art is not free from the drawback of provision of the sight hole in the same way as in the aforementioned reference devices and moreover, since the rotating direction is represented by the mechanical action, the fitting portion between the rotary body and the rotary shaft tends to wear out. Since rust occurs and foreign matters are caught at the fitting portion, troubles such as inferior operation are apt to occur. Moreover, since its construction is complicated, it can not be adapted structurally to the canned motor unless drastic modification is made to the construction of the canned motor.

Japanese Utility Model Publication No. 22,618/1963 entitled "Rotating direction indicating device of oil motor" discloses the construction which utilizes the circulating action of a liquid, caused by rotation of a rotary shaft placed in the liquid, in the same rotating direction as that of the rotary shaft so as to reverse an indicator plate in accordance with the circulating direction of the liquid, and the rotating direction is confirmed by checking with eyes the reversion of the indicator plate through a sight hole. This device can not be applied to a canned motor because of its construction, in addition to its disadvantage of necessity for the disposition of the sight hole like the aforementioned references. To enable fitting of this device to the canned motor and to allow it to work stably, it is necessary to dispose the device outside the stator can of the canned motor, and to attain this, drastic change of the construction of the canned motor is essential such as extension of the machine frame and the rotary shaft. Moreover the indicator plate tends to catch foreign matters thereby to cause inferior operation.

Japanese Utility Model Publication No. 29,303/1961 entitled "Start confirming apparatus of canned motor" and Japanese Patent Laid-Open No. 16,085/1976 entitled "Apparatus for detecting wear of bearing and rotating direction of rotor" disclose apparatuses each including permanent magnet fitted at one end of a rotary shaft and a magnetic member fitted rotatably onto the outer face of the main frame via a non-magnetic end plate so as to face the permanent magnet so that the magnetic member is rotated by a rotating magnetic field generated by rotation of the permanent magnet together with the rotary shaft, and the rotating direction of the rotary shaft is confirmed by the rotating direction of the magnetic member.

In the former apparatus, however, the magnetic needle as the magnetic member can follow up the rotary shaft only when the rotating speed of the shaft is extremely slow such as at the time of start and consequently, determination of the rotating direction becomes infeasible at other times, whereas the latter has so complicated a construction that assembly of the apparatus is much time-consuming. Further, both apparatuses attract magnetic foreign matters onto their magnets and often exhibit mal-operation. If the non-magnetic end plate is made thicker, the gap becomes wider between the permanent magnet and the magnetic member thereby to weaken the rotating magnetic field acting on the magnetic member so that application of the apparatuses is difficult to a canned motor which can withstand high pressure. Further, modification of the main frame construction of the canned motor itself becomes inevitable in order to adapt the apparatuses to the canned motor.

As described in the foregoing, each of the aforementioned apparatuses is not free from its specific drawback. Especially, the main frame of the canned motor itself must be changed in fitting the apparatus to the motor. In other words, each apparatus can not be fitted to the motor in an easy manner.

SUMMARY OF THE INVENTION

The present invention contemplates to solve these drawbacks and is characterized in that a canned motor is provided separately with a first detection section for detecting wear of a bearing, eccentricity of a rotor, swing-core operation, phase-skip operation, short-circuit operation and deformation contact of a can, and with a second detection section for detecting the rotating direction, and a greater output signal among two output signals from both detection sections is taken out by a combining circuit for the purpose of display on an indicator.

It is therefore a first object of the present invention to obtain an operation supervisory apparatus of a canned motor equipped with a first detection section for detecting mechanically abnormal operation of the canned motor such as wear of a bearing, eccentricity of the rotor, deformation contact of the can, etc., and electrically abnormal operation such as phase-skip operation, short-circuit operation, etc., and with second detection section for detecting the rotating direction of the canned motor so that two kinds of signals from these two detection sections are displayed on the same indicator.

In an operation supervisory apparatus equipped only with the abovementioned first detection section, the second object of the present invention is to enable the addition of the second detection section to the canned motor without changing its shape and size. In other words, when the remote supervision is to be carried out while the abovementioned indicator is fitted onto the control panel of the canned motor, etc., the present invention contemplates to eliminate the necessity of additionally putting an indicator, increasing the number of lead wires connecting the indicator and the canned motor and thus making it unnecessary to modify the design of the terminal box of the canned motor. When the on-site supervision is to be made while the indicator is incorporated in the canned motor, on the other hand, the present invention eliminates the necessity of additionally putting an indicator and of changing the construction of the terminal box onto which the indicator is otherwise to be fitted.

It is a third object of the present invention to obtain an operation supervisory apparatus of a canned motor which is able to convert the detection of the rotating direction of the canned motor, similarly to the detection of mechanically abnormal operation and electrically abnormal operation into the simple inspection work by only observing the indicator with eyes.

DESCRIPTION OF THE PREFERRED EMBODIMENTS

Hereinafter, the present invention will be explained with reference to embodiments thereof applied to a three-phase alternating current canned motor.

Figure 1:
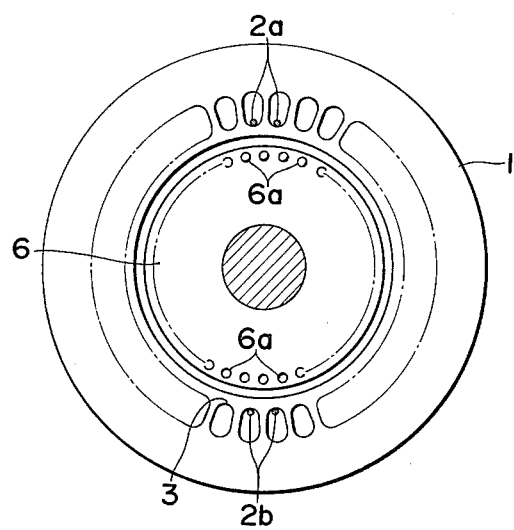
FIG. 1 is a sectional view showing the principle of detection of the operation supervisory apparatus for a canned motor in accordance with the present invention.
Figure 2:
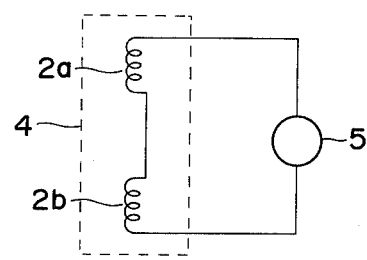
FIG. 2 is a circuit diagram of the supervisory apparatus.
Figure 3:
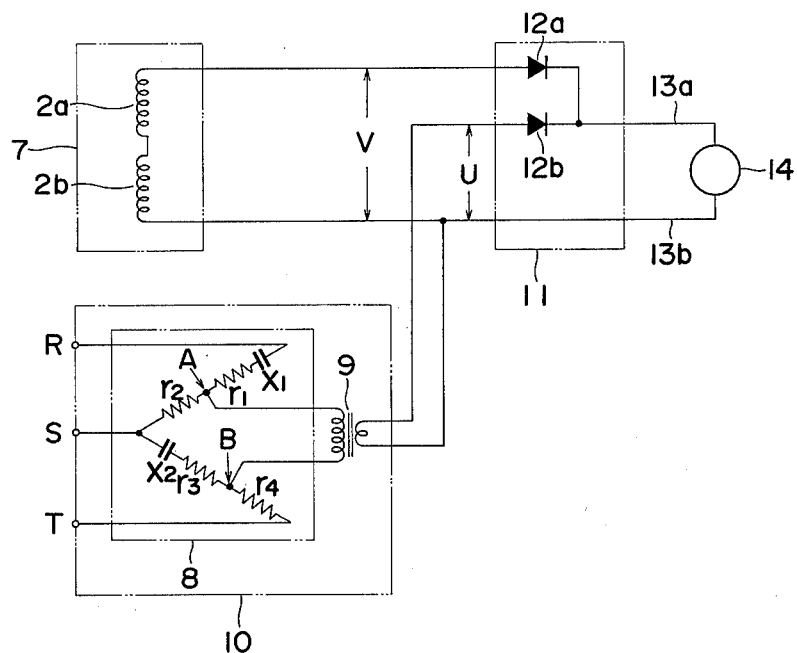
FIG. 3 is a circuit diagram showing an embodiment of the present invention.

FIG. 3 is a circuit diagram showing an embodiment of the present invention. In the same way as in the aforementioned FIGS. 1 and 2, two detection coils 2a and 2b are embedded at symmetric positions with each other with a core tooth portion 3 inside the stator core 1 of the canned motor being as their center. These detection coils are connected in series so that the fundamental wave components of the voltages induced on these detection coils 2a, 2b are offset with each other, to thereby form a first detection section 7.

Reference numeral 8 denotes a phase detection circuit which consists of a resistor and a reactance and which is wired to each power terminal R, S, T of the three-phase a.c. canned motor. A series circuit consisting of a reactance $X_1$ and resistors $r_1$ and $r_2$ is interposed between the power source terminals R and S while a series circuit consisting of a reactance $X_2$ and resistors $r_3$ and $r_4$ is interposed between the power source terminals S and T.

The primary side of a step-down transformer 9 is interposed between the junction A of the resistors $r_1$ and $r_2$ and the junction B of the resistors $r_3$ and $r_4$, thereby forming the second detection section 10.

Reference numeral 11 denotes a combining circuit consisting of two diodes 12a and 12b whose cathodes are wired to one end on the output side of the first detection section 7 and to one end on the secondary side of the step-down transformer 9, respectively. A voltmeter 14 as a display is interposed between a common line 13a connecting to the anodes of these diodes 12a, 12b and a common line 13b connecting the other end on the output side of the first detection section 7 and the other end on the secondary side of the step-down transformer 9.

The abovementioned first and second detection sections 7 and 10 as well as the combining circuit 11 are incorporated in the canned motor while the voltmeter may be disposed inside or outside the canned motor depending upon applications.

Next, the explanation will be given about the action of the abovementioned embodiment.

When the rotor 6 starts rotating upon the feed of a current, the magnetic flux cross each other on the detection coils 2a, 2b of the first detection section 7, thereby inducing a voltage. This induced voltage is a voltage in which a higher harmonic wave voltage due to the influence of the rotor grooves 6a overlaps the fundamental wave voltage so that the fundamental wave components are offset with each other at the output ends of the first detection section 7 and the combined value of the higher harmonic wave components appears as a detection voltage V.

Since both detection coils 2a, 2b are embedded at the symmetrical positions of the core tooth portion 3 inside the stator core 1 and the number of the rotor grooves 6a is even, the fundamental wave voltages induced on the both detection coils 2a, 2b have the same phase and value and the higher harmonic wave voltages have likewise the same phase and value with each other during the normal operation of the canned motor. Hence, at the output of the first detection section 7 consisting of both detection coils 2a and 2b wired in series with each other, mutual offsetting is made between the fundamental wave components and between the higher harmonic wave components to render them zero.

During abnormal operation of the canned motor such as eccentric rotation of the rotor 6 due to wear of the bearing of the canned motor, for example, the gap becomes non-uniform between the rotor 6 and the stator core 1 so that the values of the higher harmonic wave voltages induced on both detection coils 2a, 2b become great while the change in the fundamental wave voltages is negligibly small in comparison with the higher harmonic wave voltage because the change in the main magnetic flux crossing both detection coils 2a, 2b is so slight that it can hardly be detected. Accordingly, there appears at the output of the first detection section 7 a combined value of the higher harmonic values resulting from the mutual offset of the fundamental wave voltages, that is to say, the difference of both higher harmonic wave voltages, as a detection voltage V.

Figure 4:
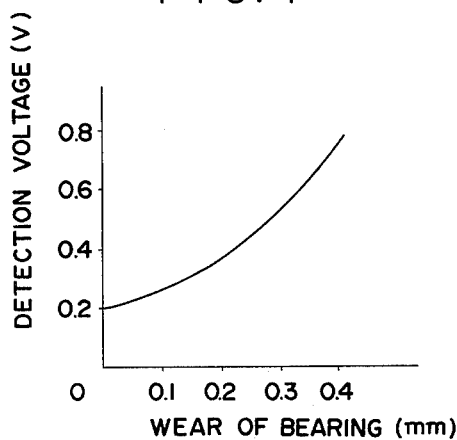
FIG. 4 is a chart showing the detection voltage and the wear rate of bearing at the first detection section.
Figure 5:
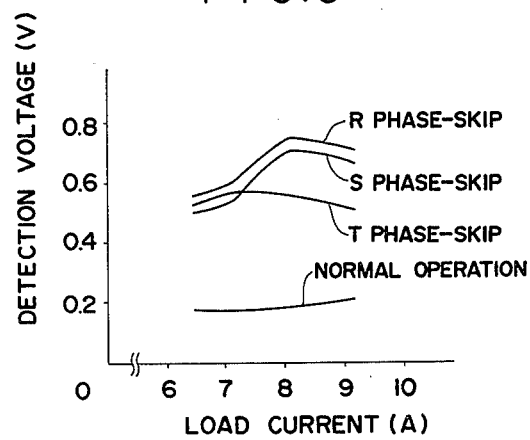
FIG. 5 is a chart showing the relation between the detection voltage at the first detection section and the load current at the time of normal operation or phase-skip operation of the canned motor.

FIG. 4 shows the relation between the detection voltage V and the wear rate of the bearing and FIG. 5 does the relation between the detection voltage V and the load current during the normal operation of the canned motor and the load current at the time of its phase-skip operation. As can be seen clearly from these drawings, the detection voltage V is increased during the abnormal operation of the motor. Incidentally, in FIG. 4, the detection voltage V does not become zero when the wear rate of the bearing is zero presumably because of the mechanical, dimensional error of the motor principally of the clearance of the plain bearing when it is used as the bearing, and presumably because of some unbalance of the voltage induced on the detection coils 2a and 2b.

When the power is fed to the canned motor, on the other hand, a balanced, three-phase alternating current is impressed to the phase detection circuit 8 of the second detection section 10 from the power terminals R, S and T. It will now be assumed that the constants of the phase detection circuit 8 are as follows:

$r_1 = r_3, r_2 = r_4, X_1 = X_2$ $r_1 : r_2 : X_1 = 1 : 2 : \sqrt{3}$

In this case, it is known well in the art that the voltage impressed to the primary side of the step-down transformer 9 of this phase detection circuit is zero when the sequence of the phases of the three-phase alternating current to be applied to the phase detection circuit 8 is positive, that is, R→S→T, and said voltage is the same voltage of the same frequency as the voltage across the power terminals R-S, S-T or T-R when the phase sequence is negative, that is, in the case of T→S→R. This voltage is reduced by the step-down transformer 9 and is produced as the detection voltage U from the second detection section 10 on the secondary side of the step-down transformer. Accordingly, when the connection between the stator winding and the power terminals R, S and T is so selected in advance that the canned motor rotates in the normal direction when the three-phase alternating current impressed to the power terminals R, S and T of the canned motor is in the positive phase sequence (R→S→T), therefore, the canned motor is allowed to rotate in the normal direction when the detection voltage U of the second detection section 10 is small (is zero in this embodiment) and in the reverse direction when the detection voltage U is large.

Now, when the detection voltage V from the detection section 7 and the detection voltage U from the second detection section 10 each detected in this manner are respectively impressed to the combining circuit 11, both detection voltage V and U are rectified and combined with each other by the action of both diodes 12a and 12b of the combining circuit 11 and the larger voltage of the two V, U is displayed on the voltmeter 14.

Figure 6:
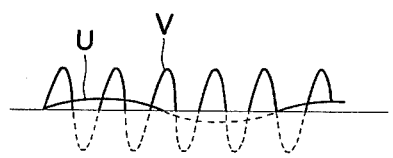
FIG. 6 is a schematic view showing the rectification voltages from the first and second detection sections at the time of normal rotation of the canned motor.
Figure 7:
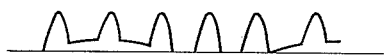
FIG. 7 is a schematic view showing the output voltage of the combining circuit at the time of normal rotation of the canned motor.
Figure 8:
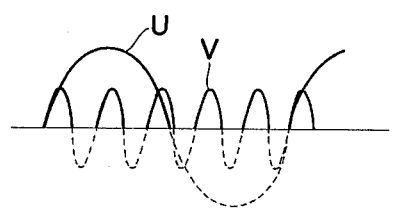
FIG. 8 is a schematic view showing the rectification voltages from the first and second detection sections at the time of reverse rotation of the canned motor.
Figure 9:
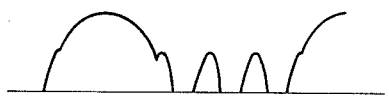
FIG. 9 is a schematic view showing the output voltage of the combined circuit at the time of reverse rotation of the canned motor.

In other words, when the canned motor rotates in the normal direction, the rectification voltage of the detection voltage U is zero in principle, but a considerable voltage is produced due to factors such as errors of the constants of the phase detection circuit 8, the unbalance of the three-phase alternating current impressed to the phase detection circuit 8 and so forth. Hence, the detection voltages V and U appear as shown in FIG. 6 so that there appears across the output terminals of the combining circuit 11 a voltage shown in FIG. 7 which is the combined sum of the detection voltages U and V. During the reverse rotation of the canned motor, on the other hand, the rectification voltage of the detection voltage U appears as shown in FIG. 8 while the rectification voltage of the detection voltage V appears as shown in FIG. 8. Hence, a voltage as a sum of combination of the detection voltages U and V appears across the output terminals of the combining circuit 11 as shown in FIG. 9.

In short, the combining circuit combines the output signal from the first detection section 7 with that from the second detection section 10, and a greater voltage among the two is displayed on the voltmeter 14. Accordingly, if the detection voltage U of the second detection section 10 is set in such a manner that the value of the detection voltage U of the second detection section 10 during the reverse rotation of the canned motor becomes greater than the value of the detection voltage V of the first detection section 7 within the range of the normal rotation of the canned motor, or, the ratio of transformation of the step-down transformer 9 is set in the abovementioned manner, it is possible to detect the abnormal operation and the reverse rotation of the canned motor in the following way.

If the voltmeter 14 displays the normal value during the actual operation of the canned motor, the canned motor operates normally and rotates in the normal direction.

If, on the other hand, the voltmeter 14 displays an abnormal value in this case, the canned motor operates abnormally or rotates in the reverse direction. Accordingly, the phase sequence of the power source current to be impressed to the canned motor is reversed to again actuate the motor. If the voltmeter 14 represents a normal value, the canned motor operates normally and rotates in the normal direction and if the voltmeter 14 represents an abnormal value, it is doubtless that the motor operates abnormally though it is not yet possible at this stage to determine whether the motor rotates in the normal direction or in the reverse direction. Hence, necesary counter-measures such as repairing must be taken by stopping the operation of the motor.

As described in the foregoing, in this embodiment, the two detection coils 2a, 2b are embedded at the symmetrical positions of the core tooth portion 3 inside the stator core 1 of the three-phase alternating current canned motor and both detection coils 2a, 2b are wired in series with each other to thereby form the first detection section 7. However, the type of the canned motor and the number of the detection coils are not particularly restricted to those of the above-mentioned embodiment and they may be suitably selected so long as they enable to pick up the combined value of the higher harmonic wave components by cancelling out mutually the fundamental wave components produced on a plurality of detection coils. As a definite example, even-numbered detection coils are disposed around the stator core of a radial air gap type canned motor having even-numbered rotor grooves so that these coils are spaced apart from each other by the pole pitch or integer times the pole pitch and are connected in series with each other.

Besides the phase detection circuit 8 illustrated in this embodiment, an optional device may be used as the second detection section 10 for detecting the rotating direction of the canned motor so long as the device is capable of detecting the rotating direction of the canned motor by means of other phase detection circuits or other phase detection methods and of generating a signal voltage. Further, though the abovementioned embodiment uses the voltmeter 14 as an indicator, the magnitude of signals of the first and second detection sections 7 and 10 may be display by a neon lamp, a light-emitting diode or the like that is lit when the voltage exceeds a certain operating voltage.

Figure 10:
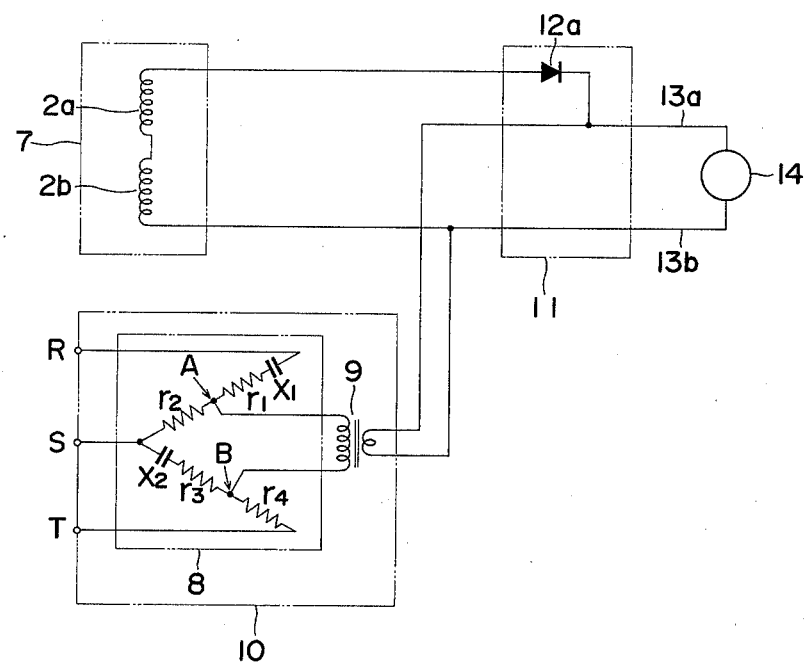
FIG. 10 is a circuit diagram showing another embodiment of the present invention.
Figure 11:
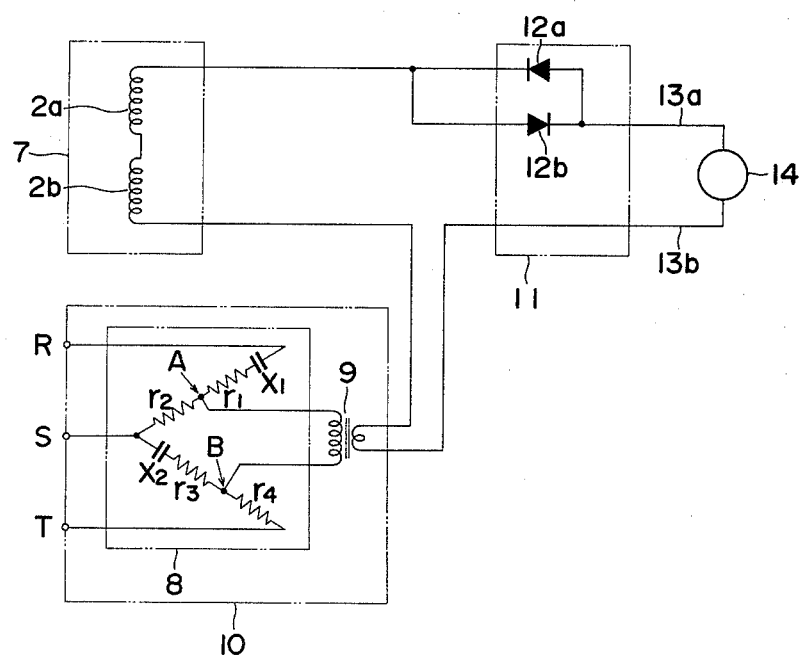
FIG. 11 is a circuit diagram showing still another embodiment of the present invention.

As to the combining circuit 11, when the output impedance of the second detection section is sufficiently higher than that of the indicator, it is possible to eliminate the diode 12b, which is to be connected to the second detection section, as shown in FIG. 10. At times, both diodes 12a and 12b may also be removed. The combining circuit may further be of such a type that is able to take out a greater signal out of two kinds of input signals as shown in FIG. 11, for example. As to the type of the canned motor, it may be a single-phase a.c. canned motor besides the three-phase a.c. canned motor.

In accordance with the present invention, the first detection section detects the mechanically abnormal operation of the canned motor such as wear of the bearing, eccentricity of the rotor, deformation contact of the can, etc. and the electrically abnormal operation such as the phase-skip operation, short-circuit operation, etc. while the second detection section detects the rotating direction of the canned motor, and the results of these detections are displayed on the same display. Accordingly, in installing an operation supervisory apparatus having one of these detection sections to a canned motor equipped with an operation supervisory apparatus having the other of the detection sections, it becomes unnecessary to additionally install a display. In carrying out the remote supervisory of the canned motor using the display, therefore, it becomes unnecessary to additionally fit lead wires from the canned motor to the display, to increase the number of terminals and to modify the terminal box of the canned motor. Further, in carrying out the on-site operation supervisory by incorporating the display in the canned motor, the present invention eliminates the necessity of changing the construction for the purpose of newly fitting the display to the motor, and enables to detect the reverse rotation of the motor in addition to the mechanically and electrically abnormal operations by simply watching visually the display. The effect of the present invention is specifically remarkable in a canned motor of an explosion-proof type which is placed in the dangerous atmosphere and for which it is impossible to connect the phase detector from the outside to confirm the rotating direction of the motor.

What is claimed is:

1. An operation supervisory apparatus of a canned motor comprising: a first detection means electrically connected to a plurality of detection coils disposed in a stator core of a canned motor and detecting mechanically abnormal operation and electrically abnormal operation of said canned motor by means of a combined value of higher harmonic wave voltages induced in said coils; a second detection means disposed in said canned motor and detecting the rotating direction of said canned motor; a combining circuit combining an output signal from said first detection means and an output signal from said second detection means and taking out the greater output signal of the two; and an indicator displaying an output signal from said combining circuit; said first and second detection means being so arranged that the output signal of said second detection means at the time of reverse rotation of said canned motor is set to a value greater than the output signal thereof at the time of normal rotation and than the output signal of said first detection means within the range of normal operation of said canned motor.

2. The operation supervisory apparatus of a canned motor as defined in claim 1 wherein said first detection means is constructed by disposing even-numbered detection coils in a stator core of a radial air gap type canned motor to space each other by a polar pitch or integer times the polar pitch and electrically connected in series with each other so that their fundamental wave components offset each other.

3. The operation supervisory apparatus of a canned motor as defined in claim 1 or 2 wherein said combining circuit is constructed by connecting one pole each of two diodes to said first detection means and to said second detection means, respectively, and the other pole each of said two diodes, to an indicator.

4. The operation supervisory apparatus of a canned motor as defined in claim 1, 2 or 3 wherein said second detection means is formed by connecting a phase detection circuit comprising a resistor and a reactance to power terminals of said canned motor.

* * * * *